United States Patent
Zukowski et al.

[11] Patent Number: 5,370,762
[45] Date of Patent: Dec. 6, 1994

[54] USE SITE PRODUCTION OF SANDBLASTING PHOTOMASKS

[75] Inventors: Raymond L. Zukowski; Randy S. Willis, both of Vista, Calif.

[73] Assignee: Rayzist Photomask, Inc., Vista, Calif.

[21] Appl. No.: 833,848

[22] Filed: Feb. 11, 1992

[51] Int. Cl.$^5$ ............................................ B32B 31/00
[52] U.S. Cl. ............................... 156/154; 156/275.5; 156/275.7; 430/5
[58] Field of Search ............... 51/312, 319, 310, 311; 430/5; 156/275.5, 272.2, 275.7, 153, 154

[56] References Cited

U.S. PATENT DOCUMENTS

| | | | |
|---|---|---|---|
| 3,808,751 | 5/1974 | Usui | 430/396 X |
| 4,522,858 | 6/1985 | Desson | 15/222 X |
| 4,746,968 | 5/1988 | Wear | 219/10.55 F |
| 4,824,498 | 4/1989 | Goodwin et al. | 156/71 |
| 4,858,394 | 8/1989 | Lalumiere et al. | 51/312 |

OTHER PUBLICATIONS

Rayzist Photomask Inc. Sandblasting Equipment, four page folded pamphlet, 1989.
"It's New! deep-cut sandblasting Made East", Rayzist Photomask, Inc., four page folded pamphlet, 1989.
"Introducing Cemetery Carved Granite", Honor Life Memorials/Rayzist Photomask, Inc., four page folded pamphlet, 1989.

*Primary Examiner*—Chester T. Barry
*Attorney, Agent, or Firm*—Nixon & Vanderhye

[57] ABSTRACT

Photomasks used for sandblasting and sandcarving may be readily produced by the user of the photomask in a simple and relatively inexpensive manner. The user places a stencil and print positive in a manual clamping structure —between a pivoted glass cover and foam covered base and exposes them to about 60–90 seconds of ultraviolet light from a 500 watt bulb. After removing the print positive, the stencil is then placed on a support surface above a tank, and reciprocating spray heads direct 100 psi, 90 degrees F. water onto the stencil to remove uncured emulsion. A combination pump-/heater within the tank recirculates tank water to the spray heads. The stencil is then hand blotted, e.g. using a lamb's wool roller, and then dried in a microwave oven at low power for about eight minutes. Then it is placed on newspaper, and hat activated liquid adhesive is placed in a pool at one end of it and manually drawn over it with a draw bar, to produce the final photomask.

23 Claims, 3 Drawing Sheets

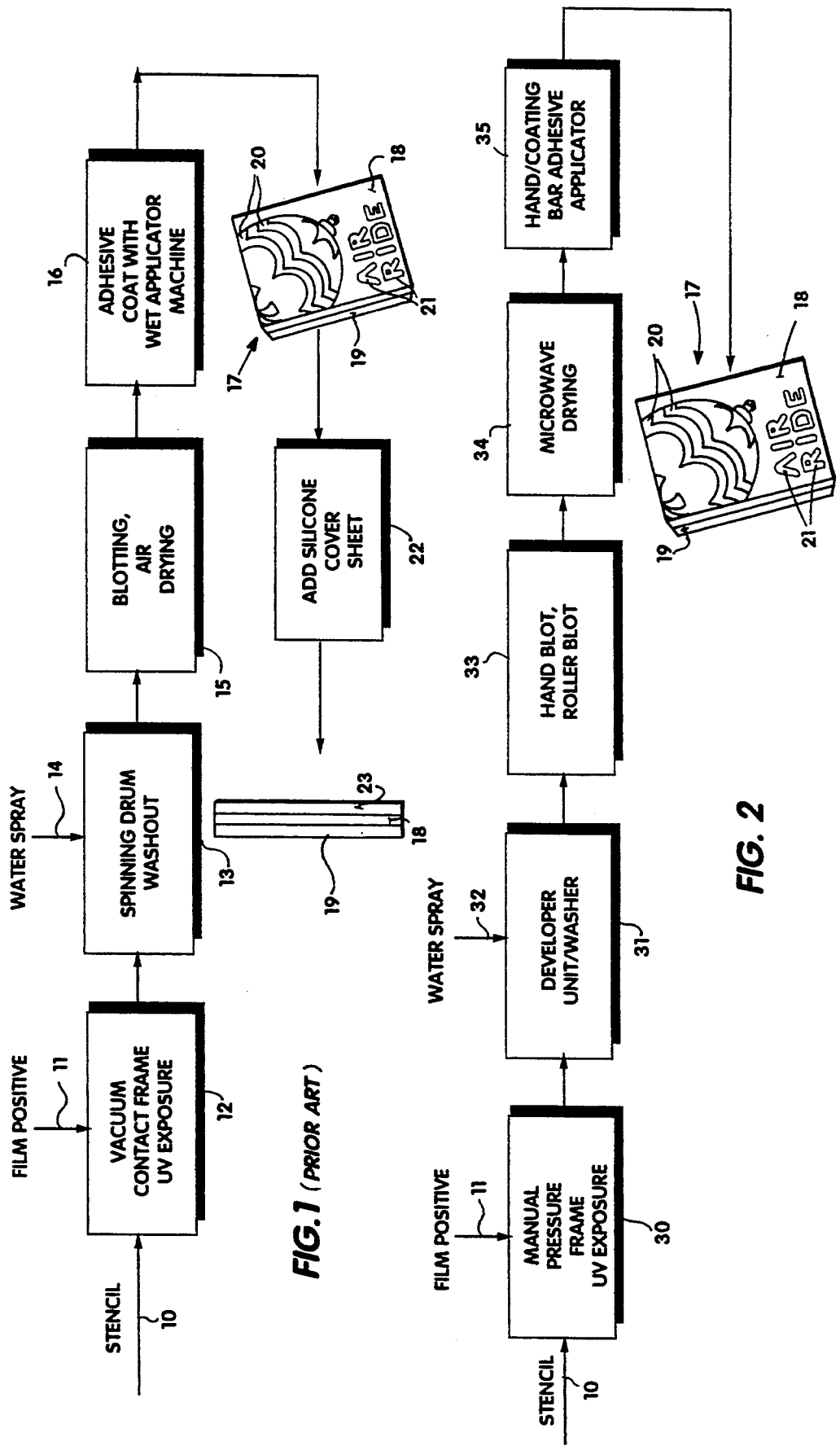

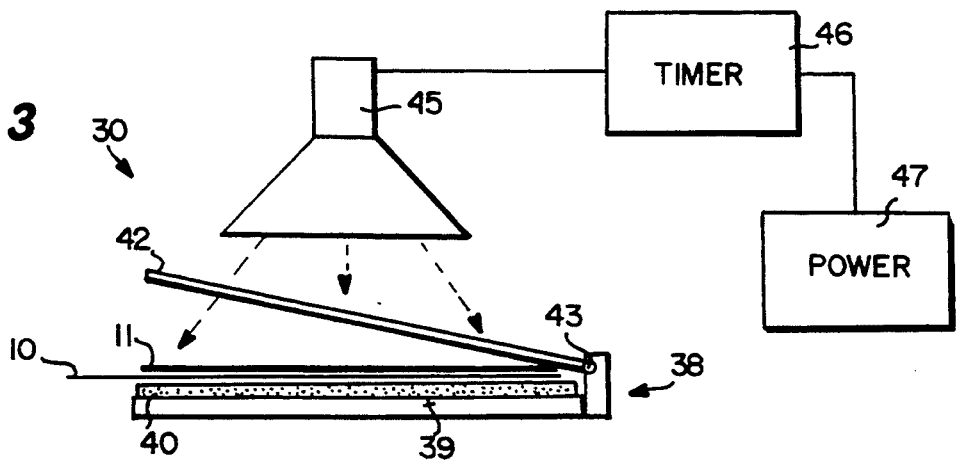
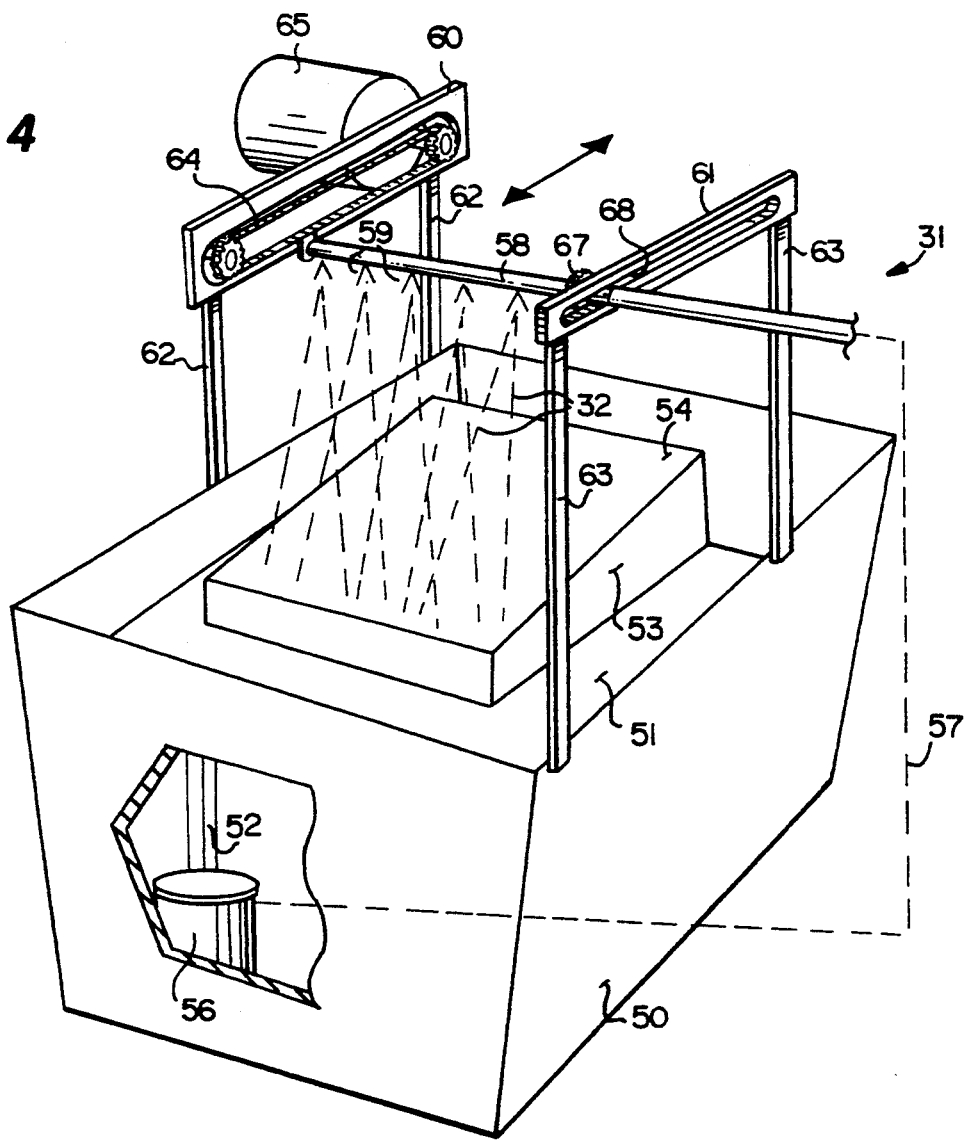

USE SITE PRODUCTION OF SANDBLASTING PHOTOMASKS

BACKGROUND AND SUMMARY OF THE INVENTION

Since 1983, photomasks have been commercially available for deep cut sandblast engraving or sandcarving highly detailed single or multi-leveled engravings in glass, crystal, stone, and even certain metals, without costly die or template set-ups. This has been achievable by a utilizing a vendor remote from the use (sandblast-/sandcarve) site to produce the photomasks. In the proprietary techniques for producing the photomask for such purposes, a silk screen emulsion (diazo sensitized polyvinyl acetate) is draw coated onto a silicone coated carrier sheet, which is dried in the dark. After drying, the coated sheet of emulsion is disposed with its emulsion face in contact with a film positive in a vacuum contact frame, and exposed to a 5,000 watt halogen UV light for 15 to 30 seconds. After exposure, the photomask is magnetically attached to a drum with the emulsion side out, inside a washout unit, and spun while 90 degree F. water at about 100 PSI is sprayed onto the drum and photomask, dissolving the unexposed (uncured) emulsion of the photomask in about three minutes. The photomask is then blotted and air dried for three hours. Finally, a thin coating of adhesive is applied with a Potdevin roller coater wet applicator machine, and a thin protective release sheet (silicone cover sheet) is placed over the adhesive.

While the photomasks produced according to the prior art process are of extraordinarily high quality and have met with great commercial success, the drawback associated with them is that they cannot be produced on the user site. That is the organization that will do the sandblast engraving or sandcarving does not have the facilities to produce photomasks utilizing this technique, nor would it be cost effective to obtain such equipment. Therefore there is a wait of two to seven days between the time of ordering of the photomasks from the supplier, and the time they are actually on the use site. This limits the potential market for personalized sandblast engraved or sandcarved items. Despite the fact that it has been known for many years in the art that the market for personalized sandblast engraved or sandcarved items would be substantially greater if the finished goods could be delivered in one to twenty-four hours, heretofore there has been no procedure or apparatus for practically accomplishing that result.

According to the present invention the major drawbacks associated with the prior art procedure which preclude its implementation at the photomask user's site are the expense of the vacuum contact frame, the energy requirements and practical utilization of the 5,000 watt UV light, the use of the spinning drum for washout of the uncured emulsion, the long drying time after washout, and the expense and sophistication of an adhesive applicator machine. All of these drawbacks are overcome by the method and apparatus according to the present invention. According to the invention it is possible to simply and relatively inexpensively, in a practical manner, effect the production of photomasks for sandblast engraving or sandcarving directly at a user's site.

According to the method of the present invention, a photomask having a carrier sheet covered by a cured design structure is produced from a stencil which comprises a carrier sheet (e.g. silicone coated paper carrier sheet) with a curable emulsion coating (e.g. silk screen emulsion). The method comprises the steps of substantially sequentially: (a) With a manual clamping structure, clamping a stencil in face-to-face contact with a print positive sheet having design elements, the stencil emulsion coating contacting the print positive. (b) Exposing the clamped stencil and print positive to emulsion curing radiation, to cure the emulsion except for areas covered by design elements of the print positive. (c) Separating the stencil from the print positive. (d) Directing streams of high pressure liquid at sufficient temperature, and with sufficient force, and for a sufficient period of time, against the stencil to remove uncured emulsion from the stencil. (e) Manually blotting the stencil. (f) Drying the stencil. And, (g) manually applying adhesive to the cured emulsion coating face of the stencil, to produce a final photomask.

By manual clamping of the stencil and print positive, the expense of a vacuum contact frame is eliminated. The manual clamping structure preferably used in the practice of the invention comprises a rigid material base having top and bottom faces with a compressible material covering on the top face of the base, and a transparent cover (typically heavy glass cover). Means are provided for pivotally mounting the transparent cover to the base so that the cover may pivot toward and away from essentially face-to-face contact with the compressible material (the stencil and print positive being sandwiched between the cover and the compressible material).

Typically the step of exposing the clamped stencil and print positive to emulsion carrying radiation is practiced by utilizing an ultraviolet light mounted above the transparent cover, and controlled by a timer. The ultraviolet light is typically a lightbulb of less than 1,000 watts, e.g. a 500 watt halogen UV light source. While this takes a slightly longer curing time (e. g. 60 to 90 seconds compared to 15-30 in the sophisticated prior art method), it allows the utilization of a light source that is much smaller, thereby increasing safety and minimizing tile possibility that special power requirements, etc. will have to be utilized.

Step (d) is preferably practiced by mounting the stencil in a stationary position while directing moving streams of high pressure liquid onto the stencil. The use of a spinning drum in a washout unit is entirely impractical for use locations, therefore an apparatus is provided according to the invention which is a little more than a tank. The apparatus comprises a tank having open top portions, with a photomask supporting surface mounted within an area defined by the tank, the surface facing generally upwardly. A number of spray heads are mounted together above the surface for movement with each other, and means are provided for moving—typically reciprocating in a generally horizontal plane—the spray heads back and forth for directing liquid from them onto different portions of the surface as the spray heads are moved.

Preferably, a recirculating pump and a heater (which may be a combined unit) is mounted within the tank and connected by a conduit (at least a portion of which is flexible ) to the spray heads to heat and recirculate liquid from the tank to the spray heads. The heater heats the water to at least 90 degrees F., while the pump pressurizes water to at least about 100 psi . The supporting surface slants downwardly from one end to the other so that the water will rinse off the uncured emulsion, and the stencil may be held onto the supporting surface by magnets to the like.

Step (e) is preferably practiced by placing the stencil on a blotting towel and manually moving a blotting roller (e.g. a lamb's wool roller) over the stencil to remove water droplets. Drying the stencil must take place quickly. The air drying time of three hours, as in the commercial sophisticated method, is totally at odds with the physical structures and the results desired by use installations. According to the present invention, a microwave oven is provided which is utilized to effect drying. The stencil—after blotting—is placed inside the oven, and the microwave is activated for about eight minutes at its lowest ("defrost") power setting, which effects drying without adversely affecting the stencil.

Machine application of adhesive also is impractical for use sites. According to the invention, step (g) is accomplished by placing a pool of adhesive at one end of the stencil, after the stencil has been placed over a disposable backing (such as newspaper), and a draw bar is manually moved over the stencil to smooth the adhesive over the entire stencil. The liquid adhesive typically is a heat curable adhesive, although it may be a pressure sensitive adhesive for some applications, and is fully operational within five minutes. The excess adhesive that has been drawn onto the news print is discarded with the news print.

It is the primary object of the present invention to provide a simple, relatively inexpensive, and practical production of photomasks for engraving sandblasting or sandcarving at the engraving/sandcarving sites. This and other objects of the invention will become clear from an inspection of the detailed description of the invention, and from the appended claims.

BRIEF DESCRIPTION OF THE DRAWINGS

FIG. 1 is a schematic representation of the prior art commercial sophisticated method for producing photomasks;

FIG. 2 is a view like that of FIG. 1 showing the invention;

FIG. 3 is a side schematic view showing the exemplary clamping and emulsion curing apparatus according to the present invention;

FIG. 4 is a schematic perspective view of the exemplary washout apparatus according to the invention;

DETAILED DESCRIPTION OF THE DRAWINGS

Figure 6:
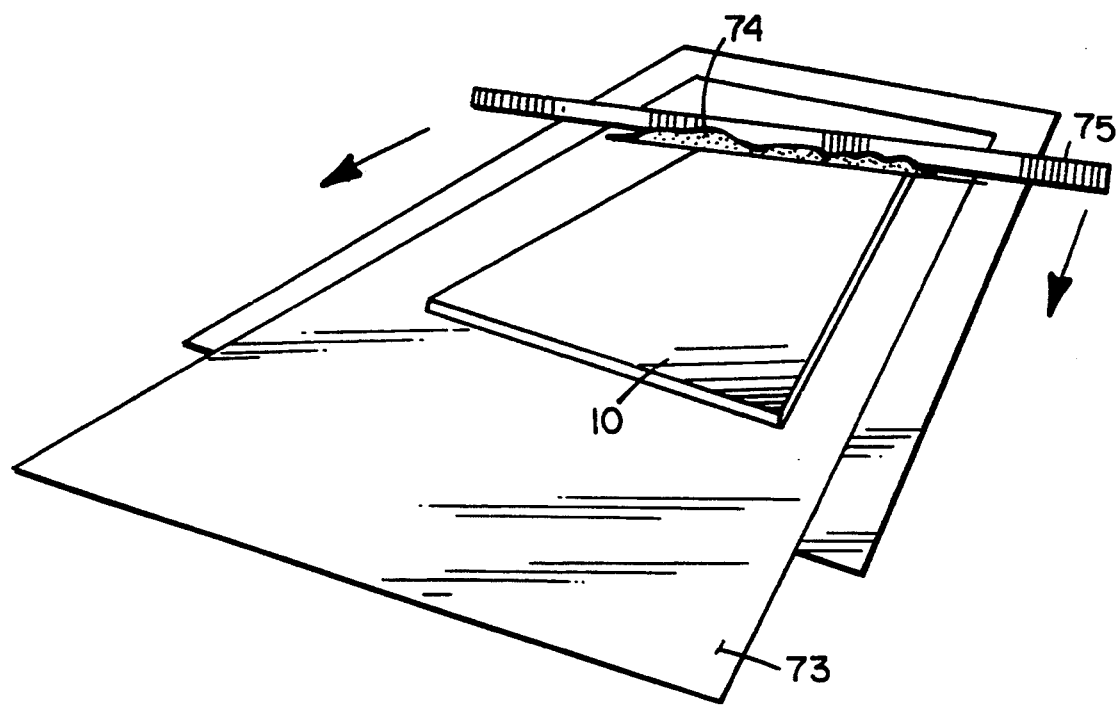
FIG. 6 schematically illustrates adhesive application according to the invention.

The prior art process for effectively producing photomasks for sandblast engraving or sandcarving is schematically illustrated in FIG. 1. Pursuant to this method, a stencil 10 comprising a silicone coated paper sheet having a draw coating of silk screen emulsion (diazo sensitized polyvinyl acetate) and a film positive 11 are placed into operative association with each other in the vacuum contact frame 12 and exposed to a 5,000 watt halogen UV light for about 15 to 30 seconds. After exposure, the stencil is separated from the film positive, and is magnetically attached to a spinning drum in the washout system 13, with a water spray 14 being directed at the stencil on the spinning drum. The water has a temperature of about 90 degrees F., and a pressure of about 100 psi and dissolves the unexposed (uncured) areas of the stencil in about three minutes.

After washout, the stencil is blotted and air dried for about three hours, as indicated by block 15, and then is inserted into a Potdevin roller coater wet applicator machine 16 in which a thin coating of adhesive (such as a heat activated adhesive, or a pressure sensitive adhesive) is applied. The photomask 17 produced according to this method includes the cured emulsion 18 which is the actual photomask, and the carrier sheet 19. The line areas 20 of the design of the cured emulsion photomask 18 allow the sand particles to penetrate while the body of the mask 18 does not. Of course lettering 21 may also be provided, essentially any design elements almost regardless of the intricacy of the design.

In order to protect the adhesive that has been applied to the cured emulsion photomask 18, a release sheet (silicone cover sheet) is applied over it at block 22, the silicone cover sheet 23 being illustrated in FIG. 1. The photomask with silicone cover sheet 23 is then shipped to the use location, where the cover sheet 23 is removed, the adhesive is exposed to a heat source (e.g. an incandescent light source) to warm it to approximately 100 degrees F., and then the design element/emulsion cured portion 18 is placed onto the glass, crystal, stone, or the like structure to be sandblast engraved. Then with a metal tipped burnisher, the cured emulsion/mask 18 is transferred onto the surface, the carrier sheet 19 is peeled away, and the article is ready for sandblast engraving or sandcarving.

The method according to the invention is illustrated schematically in FIG. 2. Components the same as those in the prior art method of FIG. 1 are illustrated by the same reference numeral. Note that the same stencil 10 and film positive 11 are utilized, and the same final product 17 is produced, however the individual components and procedures for acting on stencil 11 are significantly different.

According to the method illustrated schematically in FIG. 2, the stencil 10 and film positive 11 are placed together in a manual pressure frame structure 30 for ultraviolet light (or other curing radiation) exposure. Then the stencil is placed on a surface of a developer unit/washer 31, a water spray 32 being provided to wash out the uncured emulsion. Then the stencil 11 is hand blotted, such as with a roller blotter, at stage 33, inserted in a microwave oven for microwave drying at stage 34, and then has adhesive applied thereto with a draw bar manual adhesive applicator at stage 35.

The equipment for the stage 30 is illustrated schematically in FIG. 3. This equipment includes a manual clamping assembly 38 which has a rigid material base 39 with top and bottom surfaces, with a covering 40 of compressible material on the top surface of the base 39. The material 40 preferably is a plastic foam pad. A transparent cover 42, preferably a relatively heavy glass pane, is mounted by any suitable conventional pivot mechanism 43 to the base 39 so that it is movable toward and away from the compressible material 40, to sandwich the stencil 10 and film positive 11 between the foam 40 and the transparent cover 42. The emulsion coating on the stencil 10 is placed face up, while the emulsion of the film positive 11 is placed in contact with it. The transparent cover 42 may be held in contact with the film positive 11 by a clamping or latching mechanism, or merely by the weight of the cover 42.

The apparatus 30 also comprises a halogen UV light source 45, typically less than a 1,000 watt light source (e.g. a 500 watt light source). The UV light source 45 is controlled by a timer 46, which connects it to a power source 47, such as a conventional 110/120 volt line. The timer 46 is activated to energize the light 45 for about 60–90 seconds, with the radiation from the light 45 passing through the transparent cover 42 and curing all of the exposed areas of the stencil 10 (that is those areas not covered by the design elements of the film positive 11).

After treatment in the unit 30, the stencil 10 is separated from the print positive 11, and then is placed in operative association with the washout system 31, which is illustrated in detail in FIG. 4.

The apparatus 31 includes a tank 50 having open top portions (as seen in FIG. 4), with an interior structure 51 having legs 52 supporting it, e.g. on the bottom of the tank 50, and with a support structure 53 thereon. The support structure 53 includes a supporting surface 54 which slopes downwardly from one end to the other, and on which the stencil 10 is adapted to be mounted. The surface 54 has an area that is typically slightly greater than that of the stencil 10, and the stencil 10 may be held on the surface 54 by any suitable means, such as clamps, magnets (if the surface 54 is of a magnetic material such as steel), or the like.

Mounted within the tank 50 is the structure 56, which preferably is a combined pump and water heater. It must be capable of pumping water to a pressure of at least about 100 psi, and capable of heating the water to at least about 90 degrees F. A conduit 57—shown only schematically in FIG. 4—at least a part of which is flexible, is connected from the pump/heater 56 to a support conduit/header 58 for a plurality of spray heads 59. At its opposite ends, the header 58 is mounted by horizontally extending support structures 60, 61, which in turn are supported by legs 62, 63 either to the tank 50, or to some other adjacent structure. A conventional chain drive 64 or the like, driven by a chain drive motor 65, effects reciprocation of the header 58—and spray heads 59 attached thereto—in a generally horizontal plane, above the support surface 54. The support structures 61 has an elongated slot 68 formed therein, with an extension 67 from the header 58 extending through the slot 68 and connected up to the at least partially flexible conduit 57.

In operation, the apparatus 31 of FIG. 4 operates to wash out the uncured emulsion from the stencil 10 which is placed on the surface 54, the spray heads 59 being reciprocated back and forth as indicated by the arrows. After about three minutes, the warm, high pressure water has removed all of the uncured emulsion, which has passed into the tank 50. If desired, a filtering mechanism can be associated with the tank 50 or unit 56 for filtering the emulsion out of the water being recirculated.

Figure 5:
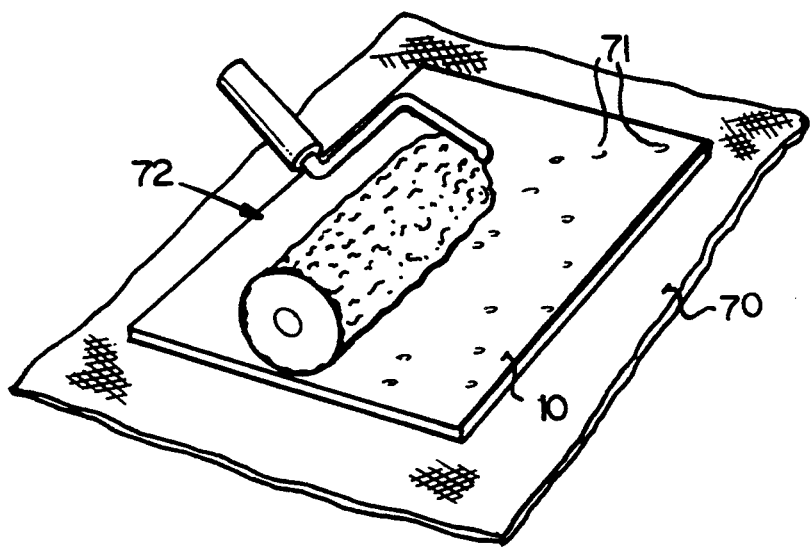
FIG. 5 schematically illustrates blotting out techniques utilizing blotting out apparatus according to the invention.

After the stencil 10 is removed from the structure 31, it must be properly blotted and dried. Blotting is preferably accomplished by placing the stencil 10 on a lint free blotting towel 70 (see FIG. 5), and placing another towel on the top. For any remaining water droplets 71, the hand roller 72, which preferably has a lambs wool surface, is rolled over the stencil 11 to evenly blot away the remaining droplets 71.

After blotting the stencil 10 is placed into a conventional microwave oven. It is set at the lowest power setting (e.g. "defrost") and activated for a sufficient time to effect complete drying, typically about eight minutes. This short drying time is important in order to practically effect production of photomasks on site since such sites typically have insufficient space, nor are the time requirements sufficient, to allow for air drying.

After drying in the microwave, the stencil 10 is placed on a disposable backing, such as a sheet of newspaper 73 (see FIG. 6), and a pool of liquid adhesive 74 is placed at one end of the stencil 10. Then utilizing the draw bar 75, the liquid adhesive 74 is manually applied by moving the wire wrapped coating bar 75 in the directions of the arrows in FIG. 6 to evenly apply the adhesive to the stencil 10. Any excess adhesive is moved onto the newspaper 73, and discarded with the newspaper. The adhesive typically is a heat activated adhesive, although it may be a pressure sensitive adhesive, and dries/cures in the air in about five minutes, at which time it is ready to be utilized for sandblast engraving or sandcarving in exactly the same manner as described above for the photomasks produced by the conventional process.

It will thus be seen that according to the present invention with a minimum of expensive and sophisticated equipment, and in a safe and relatively inexpensive manner, photomasks for sandblast engraving or sandcarving may be efficiently produced on site. Since the masks are produced directly on site it is rarely necessary to apply a release coating over the adhesive, but rather the structure 18 (after heating) may be moved directly onto the glass, crystal, stone, or like surface to be engraved.

While the invention has been herein shown and described in what is presently conceived to be the most practical embodiment thereof, it will be appreciated that many modifications may be made thereof within the scope of the invention, which scope is to be accorded the broadest interpretation of the appended claims so as to cover all equivalent methods and devices.

What is claimed is:

1. A method of making a photomask having a carrier sheet covered with a cured design structure, from a stencil comprising a carrier sheet with a curable emulsion coating at a use site for the photomask, comprising the steps of substantially sequentially at the use site;
   (a) with a manual clamping structure, clamping a stencil in face-to-face contact with a print positive sheet having design elements, the stencil emulsion coating contacting the print positive;
   (b) exposing the clamped stencil and print positive to emulsion curing radiation, to cure the emulsion except for areas covered by design elements of the print positive;
   (c) separating the stencil from the print positive;
   (d) mounting the stencil in a stationary position while directing moving streams of high pressure liquid at sufficient temperature, and with sufficient force, and for a sufficient period of time, against the stencil to remove uncured emulsion from the stencil;
   (e) manually blotting the stencil;
   (f) drying the stencil; and
   (g) manually applying adhesive to the cured emulsion coating face of the stencil, to produce a final photomask;
   (h) applying the final photomask to a product at the use site; and
   (i) sandblast engraving or sand carving the product at the use site.

2. A method as recited in claim 1 wherein step (f) is practiced by microwave drying.

3. A method as recited in claim 2 wherein step (e) is practiced by placing the stencil on a blotting towel and manually moving a blotting roller over the stencil to remove water droplets.

4. A method as recited in claim 2 wherein step (a) is practiced using a clamping structure having a transparent hinged cover connected to a rigid base with a compressible covering on the rigid base facing the transparent hinged cover, by placing the stencil carrier sheet on and in contact with the compressible covering, placing the print positive on top of the stencil, and pivoting the transparent cover into contact with the print positive.

5. A method as recited in claim 4 wherein the emulsion is cured by ultraviolet radiation, and wherein step (b) is practiced by directing ultraviolet radiation through the transparent cover for approximately 60–90 seconds.

6. A method as recited in claim 1 wherein step (d) is further practiced using a reciprocating spray head assembly, by reciprocating the spray head assembly back and forth over the stencil.

7. A method as recited in claim 6 wherein the spray head assembly is connected by a flexible conduit to a combination pump and heater located in a tank beneath the stencil; and wherein step (d) is further practiced by recirculating the liquid sprayed onto the stencil by the spray head assembly from the tank to the spray head assembly through the combination pump and heater.

8. A method as recited in claim 1 wherein step (d) is further practiced by heating the liquid to at least about 90 degrees F., and pressurizing it to at least about 100 psi, before spraying it on the stencil.

9. A method as recited in claim 1 wherein step (f) is practiced by microwave drying the stencil in a microwave oven at low power for approximately eight minutes.

10. A method of making a photomask having a carrier sheet covered with a cured design structure, from a stencil comprising a carrier sheet with a curable emulsion coating at a use site for the photomask, comprising the steps of substantially sequentially at the use site:

(a) with a manual clamping structure, clamping a stencil in face-to-face contact with a print positive sheet having design elements, the stencil emulsion coating contacting the print positive;

(b) exposing the clamped stencil and print positive to emulsion curing radiation, to cure the emulsion except for areas covered by design elements of the print positive;

(c) separating the stencil from the print positive;

(d) directing streams of high pressure liquid at sufficient temperature, and with sufficient force, and for a sufficient period of time, against the stencil to remove uncured emulsion from the stencil;

(e) manually blotting the stencil;

(f) microwave drying the stencil; and (g) manually applying adhesive to the cured emulsion coating face of the stencil, to produce a final photomask;

(h) applying the final photomask to a product at the use site; and (i) sandblast engraving or sand carving the product at the use site.

11. A method as recited in claim 13 consisting essentially of steps (a)–(i).

12. A method as recited in claim 13 wherein step (g) is practiced by applying a heat activated, non-pressure sensitive, adhesive.

13. A method as recited in claim 10 wherein step (f) is practiced by microwave drying the stencil in a microwave oven at low power.

14. A method as recited in claim 10 wherein step (a) is practiced using a clamping structure having a transparent hinged cover connected to a rigid base with a compressible covering on the rigid base facing the transparent hinged cover, by placing the stencil carrier sheet on and in contact with the compressible covering, placing the print positive on top of the stencil, and pivoting the transparent cover into contact with the print positive.

15. A method as recited in claim 14 wherein the emulsion is curable by ultraviolet radiation, and wherein step (b) is practiced by directing ultraviolet radiation from a less than 1,000 watt source through the transparent cover for approximately 60–90 seconds.

16. A method as recited in claim 15 wherein step (g) is practiced by placing the stencil on a disposable backing, applying a pool of dryable liquid adhesive adjacent one end of the stencil, and manually drawing the adhesive over the entire stencil with a draw bar.

17. A method as recited in claim 16 wherein step (e) is practiced by placing the stencil on a blotting towel and manually moving a blotting roller over the stencil to remove water droplets.

18. A method of making a photomask having a carrier sheet covered with a cured design structure, from a stencil comprising a carrier sheet with a curable emulsion coating at a use site for the photomask, comprising the steps of substantially sequentially at the use site:

(a) using a manual clamping structure having a transparent hinged cover connected to a rigid base with a compressible covering on the rigid base facing the transparent hinged cover, placing a stencil carrier sheet on and in contact with the compressible covering, placing a print positive with design elements on top of the stencil, and pivoting the transparent cover into contact with the print positive to clamp the stencil emulsion coating in contact with the print positive;

(b) exposing the clamped stencil and print positive to emulsion curing radiation, to cure the emulsion except for areas covered by design elements of the print positive;

(c) separating the stencil from the print positive;

(d) directing streams of high pressure liquid at sufficient temperature, and with sufficient force, and for a sufficient period of time, against the stencil to remove uncured emulsion from the stencil;

(e) manually blotting the stencil;

(f) drying the stencil; and (g) manually applying adhesive to the cured emulsion coating face of the stencil, to produce a final photomask;

(h) applying the final photomask to a product at the use site; and (i) sandblast engraving or sand carving the product at the use site.

19. A method as recited in claim 14 wherein step (g) is practiced by placing the stencil on a disposable backing, applying a pool of dryable liquid adhesive adjacent one end of the stencil, and manually drawing the adhesive over the entire stencil with a draw bar.

20. A method as recited in claim 14 wherein the emulsion is curable by ultraviolet radiation, and wherein step (b) is practiced by directing ultraviolet radiation from a less than 1,000 watt source through the transparent cover for approximately 60–90 seconds.

21. A method of making a photomask having a carrier sheet covered with a cured design structure, from a stencil comprising a carrier sheet with a curable emulsion coating at a use site for the photomask, comprising the steps of substantially sequentially at the use site:
(a) with a manual clamping structure, clamping a stencil in face-to-face contact with a print positive sheet having design elements, the stencil emulsion coating contacting the print positive;
(b) exposing the clamped stencil and print positive to emulsion curing radiation, to cure the emulsion except for areas covered by design elements of the print positive;
(c) separating the stencil from the print positive;
(d) directing streams of high pressure liquid at sufficient temperature, and with sufficient force, and for a sufficient period of time, against the stencil to remove uncured emulsion from the stencil;
(e) manually blotting the stencil;
(f) drying the stencil; and
(g) manually applying adhesive to the cured emulsion coating face of the stencil, to produce, after air drying of the adhesive, a final photomask, by placing the stencil on a disposable backing, applying a pool of liquid adhesive adjacent one end of the stencil, and manually drawing the adhesive over the entire stencil with a draw bar;
(h) applying the final photomask to a product at the use site; and
(i) sandblast engraving or sand carving the product at the use site.

22. A method as recited in claim 10 wherein step (a) is practiced using a clamping structure having a transparent hinged cover connected to a rigid base with a compressible covering on the rigid base facing the transparent hinged cover, by placing the stencil carrier sheet on and in contact with the compressible covering, placing the print positive on top of the stencil, and pivoting the transparent cover into contact with the print positive; and wherein the emulsion is curable by ultraviolet radiation, and wherein step (b) is practiced by directing ultraviolet radiation from a less than 1,000 watt source through the transparent cover for approximately 60–90 seconds.

23. A method as recited in claim 16 wherein step (g) is practiced by applying a heat activated non-pressure sensitive, adhesive.

* * * * *